United States Patent [19]
Monti et al.

[11] Patent Number: 6,104,235
[45] Date of Patent: *Aug. 15, 2000

[54] INTEGRATED CIRCUIT WITH TRIMMABLE PASSIVE COMPONENTS

[75] Inventors: Marco Maria Monti, Milan; Domenico Rossi, Cilavegna, both of Italy

[73] Assignee: STMicroelectronics S.r.l., Agrate Brianza, Italy

[*] Notice: This patent issued on a continued prosecution application filed under 37 CFR 1.53(d), and is subject to the twenty year patent term provisions of 35 U.S.C. 154(a)(2).

[21] Appl. No.: 07/861,144

[22] Filed: Mar. 31, 1992

[30] Foreign Application Priority Data

Apr. 30, 1991 [IT] Italy ................. MI91A1187

[51] Int. Cl.$^7$ ........................................ H03B 1/00
[52] U.S. Cl. .................... 327/554; 327/337; 327/555; 327/562; 327/563
[58] Field of Search ................... 307/490, 494, 307/496, 501, 359, 520; 328/167; 327/73, 334, 337, 355, 551, 552, 553, 554, 555, 560, 562, 563; 330/109, 294

[56] References Cited

U.S. PATENT DOCUMENTS

| | | | |
|---|---|---|---|
| 3,433,937 | 3/1969 | McCarthy | 327/337 |
| 4,050,055 | 9/1977 | DiLeo . | |
| 4,070,632 | 1/1978 | Tuttle | 330/86 |
| 4,132,957 | 1/1979 | Hekimian et al. | 330/51 |
| 4,328,465 | 5/1982 | Takaoka et al. | 330/151 |
| 4,509,021 | 4/1985 | Van Uden | 330/282 |
| 4,546,651 | 10/1985 | Merrick | 73/701 |
| 4,569,072 | 2/1986 | van Roermund | 327/556 |
| 4,628,276 | 12/1986 | Mizutani | 330/86 |
| 4,644,304 | 2/1987 | Temes | 330/107 |
| 4,683,386 | 7/1987 | Kamikawara . | |
| 4,855,685 | 8/1989 | Hochschild | 330/282 |
| 4,859,936 | 8/1989 | Ecclestron | 324/130 |
| 4,888,496 | 12/1989 | Schmitz | 307/264 |
| 4,897,662 | 1/1990 | Lee et al. . | |
| 4,920,325 | 4/1990 | Nicollini et al. | 330/109 |
| 4,933,631 | 6/1990 | Ecclestron | 324/115 |
| 4,942,367 | 7/1990 | Milkovic | 330/51 |
| 5,025,172 | 6/1991 | Carroll et al. | 327/130 |
| 5,164,620 | 11/1992 | Kalaf | 307/493 |

FOREIGN PATENT DOCUMENTS

| | | |
|---|---|---|
| 0143493 | 6/1985 | European Pat. Off. . |
| 0322963 | 7/1989 | European Pat. Off. ....... H03H 19/00 |
| WO 89/02192 | 3/1989 | WIPO ............ H03K 17/00 |

OTHER PUBLICATIONS

Xicor, 1988 Patents Pending, "E$^2$POT™ Digitally Controlled Potentiometer," pp. 3–3, 3–13 (1988).

Alan B. Grebene, Bipolar and MOS Analog Integrated Circuit Design, pp. 155–159 (1984).

Richard Palm, "Solid–State Potentiometer," Machine Design, May 22, 1986, pp. 98, 100.

*Primary Examiner*—Terry D. Cunningham
*Attorney, Agent, or Firm*—David V. Carlson; E. Russell Tarleton; Seed and Berry LLP

[57] ABSTRACT

An integrated circuit having a passive circuit component that can be adjusted following the manufacturing process to provide a precise absolute value for resistance or capacitance. A plurality of passive elements are selectively combinable using logic gates to include or exclude each element from a network, wherein the combined value of the included passive elements equals the value of the passive circuit component. The logic gates are set by outputs from a decoder to reduce the required inputs to the chip.

7 Claims, 3 Drawing Sheets

INTEGRATED CIRCUIT WITH TRIMMABLE PASSIVE COMPONENTS

TECHNICAL FIELD OF THE INVENTION

The present invention relates to an integrated circuit having passive components whose values can be adjusted in a reversible manner after fabrication of the circuit.

BACKGROUND OF THE INVENTION

A difficult problem in integrated circuit manufacturing is the inability to precisely set the absolute values of passive components such as resistors and capacitors. Good relative precision can be achieved if the passive components are the same type and are on the same integrated circuit, but it has not been possible to reliably achieve a high degree of precision for the absolute values of such passive components.

The variance in the values of passive components from the specified value can be traced to inherent minor variations in the manufacturing process, as, for example, variations in lithography precision, dopant amounts, and oxide thicknesses. The absolute values of these passive components can be estimated during design but cannot be fabricated with precisions using conventional processes.

In some cases, the operating characteristics of a circuit depend on the ratios of the values of passive components, which remain constant if the passive components on such a circuit are affected by similar process variations. Predictable operating characteristics can then be achieved.

There are instances, however, in which the operating characteristics of an integrated circuit are linked to the absolute values of the components, thus requiring high absolute precision for the passive component values. Since it is not possible to obtain precise absolute values for passive components by conventional manufacturing, it would be desirable to be able to trim or adjust the value of the passive components after the circuit has been fabricated.

It is known that a resistor with an adjustable value can be manufactured in the form of a network of resistive elements having metal fuses and shunts. The shunts can be zapping Zener diodes accessible by external circuitry. After measuring the value of the resistor and comparing it with the desired value, the resistor is trimmed or adjusted by melting one or more fuses to increase resistance or by burning out one or more zapping Zener diodes to reduce resistance. Selected fuses can be melted and selected Zener diodes can be burned out by injecting high currents into corresponding circuit pads at the periphery of the chip.

The above described trimming method has various disadvantages which limit its use. First, the intense currents which must be injected into the circuit to create a new connection (for the Zener diodes) or destroy an established connection (for the fuses), may cause unpredictable changes in the rest of the circuit. Second, the new connection formed during the trimming process becomes an integral part of the circuit, often unpredictably altering the circuit's operating characteristics. Third, because the new connections are permanent, procedures must be used to gradually bring the circuit to the desired condition by a sequence of irreversible operations which are particularly slow and expensive. Lastly, it is necessary to provide an extra circuit pad for each trimming element causing an undesirable increase in the size of the integrated circuit chip.

SUMMARY OF THE INVENTION

A principal object of the invention is to provide an integrated circuit having passive components whose values can be adjusted after fabrication with a high degree of precision and predictability.

Another object of the invention is to provide an integrated circuit having passive components whose values can be adjusted without injecting high currents into the circuit.

Another object of this invention is to provide an integrated circuit having passive components whose values can be adjusted reversibly.

Still another object of the invention is to provide a more efficient process for adjusting the values of passive components on an integrated circuit.

These and other objects are achieved with an integrated circuit which includes a network of passive elements connected between a first node and a second node. These passive elements (e.g., resistors or capacitors) can be selectively connected to one another between the first and second nodes in a parallel arrangement or series arrangement or various parallel-series combinations. A plurality of logic gates are used to selectively include or exclude each passive element from contributing to the value of the passive component represented by the equivalent circuit of the network between the first and second nodes. Each logic gate has a control terminal which can be controlled from outside the integrated circuit in order to open or close the logic gate to include or exclude a corresponding passive element from functioning as part of the network.

BRIEF DESCRIPTION OF THE DRAWINGS

The novel features believed characteristic of the invention are set forth in the appended claims. The nature of the invention, however, as well as its essential features and advantages, may be understood more fully upon consideration of illustrative embodiments, when read in conjunction with the accompanying drawings, wherein:

DETAILED DESCRIPTION

Figure 1:
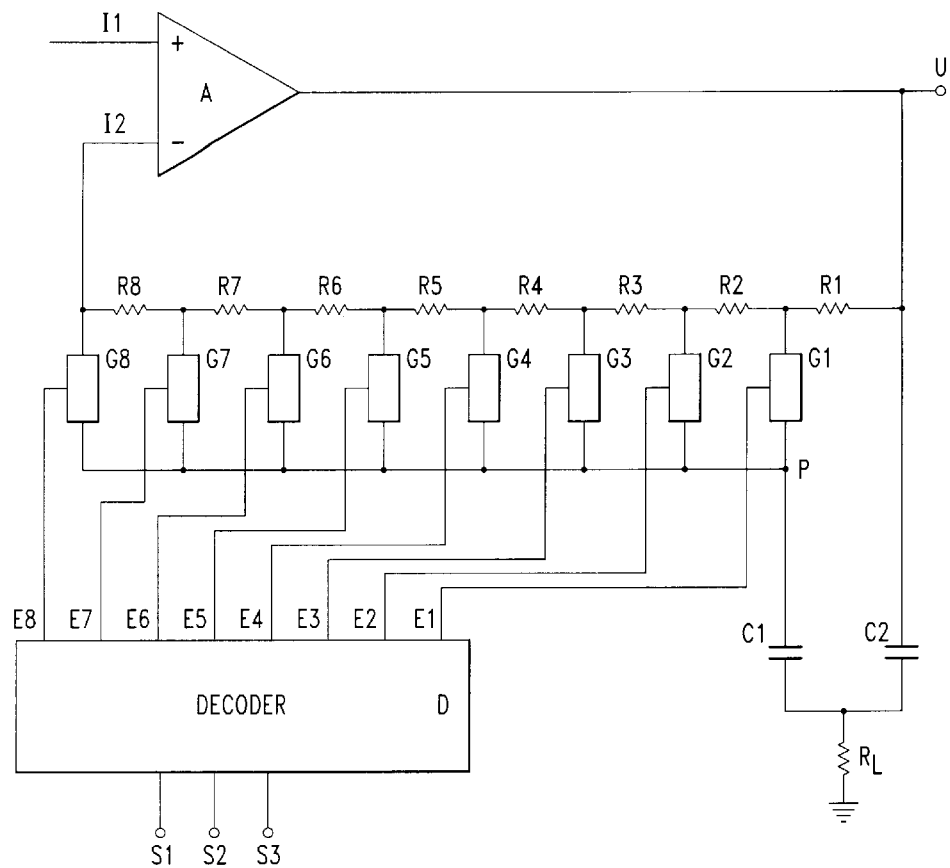
FIG. 1 is a circuit diagram of one embodiment of the invention.

With reference to FIG. 1, the invention will be described in the context of a filter circuit, which is an example of one of numerous useful applications of the invention. An amplifier A has first and a second inputs, I1 and I2, and an output U. A feedback network is connected between the output U and the input I2 and comprises eight resistor elements R1, R2, . . . , R8 arranged in series. CMOS logic gates G1, G2, . . . , G8 are connected to each node between two adjacent resistor elements R1, R2, . . . , R8. Each logic gate has an opposite terminal connected to a common node or point P.

The feedback network also includes two capacitors C1 and C2, and a load resistor $R_L$ which is connected to the ground potential. The load resistor $R_L$ is coupled to common point P by capacitor C1 and to the output node by capacitor C2. Each logic gate has a respective control terminal which is connected to a respective output E1, E2, . . . , E8 of a digital decoder D. The decoder D has three inputs which are connected to three circuit pads S1, S2 and S3 located at the periphery of the integrated circuit chip (not shown) such that the decoder can be accessed by external circuitry.

The decoder D converts the three-bit word formed by the digital signals applied to the three circuit pads S1, S2 and S3 so as to produce a high value on a selected one of the output lines E1–E8. In this manner, the decoder controls a selected one of the logic gates G1–G8 between conductive and non-conductive states. Each gate is capable of connecting one or more of the resistor elements R1–R8 between the output node U and the common point P. The following are possibilities of insertion of resistive values between the output U of the amplifier A and the common point P:

R1
R1+R2
R1+R2+R3
R1+R2+R3+R4
R1+R2+R3+R4+R5
R1+R2+R3+R4+R5+R6
R1+R2+R3+R4+R5+R6+R7
R1+R2+R3+R4+R5+R6+R7+R8.

These values correspond to the values achieved if respective gates G1, G2, G3, G4, G5, G6, G7 or G8 are turned on or made conductive.

Starting from the base resistor R1, it is possible to progressively increase the value of resistance until the optimum performance of the circuit is obtained. The optimum value of resistance is obtained without introducing high currents into the integrated circuit. Additionally, it will be appreciated that the process of adjusting the resistance value is reversible.

The decoder also performs as an isolator between the circuit pads S1, S2 and S3 and the logic gates G1–G8. This isolation avoids the application of currents or voltages which are harmful to the circuit.

After the trimming operation has been performed using the circuit of FIG. 1, only one conductive CMOS gate is in series between nodes U and P. The resistance value of R1 or a series of up to eight resistor elements can thus be selected. The selected resistance value is not affected by the unpredictable resistance value of a burned-out Zener diode. Those skilled in the art will appreciate that this invention improves the precision and predictability of the trimming process over prior methods.

Trimming can be made permanent by setting the input word of the decoder using zapping Zener diodes (not shown). In this case, the high currents required to melt the diode are separated from the signal paths by the decoder D acting as an isolator. That is, the decoder D isolates the remainder of the circuit from the high currents so no damage occurs.

Figure 2:
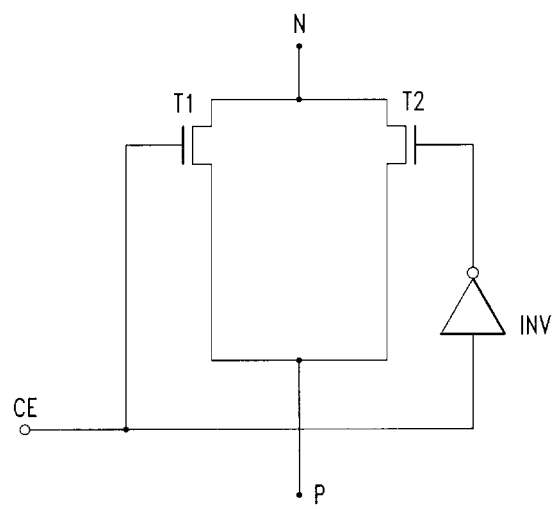
FIG. 2 is a diagram of a logic gate for use in the circuit of FIG. 1.

FIG. 2 shows a preferred implementation of each individual logic gate. These logic gates comprise an N-channel CMOS transistor T1 and a P-channel CMOS transistor T2. These transistors are connected in parallel between node N (representing one of the nodes shared by two resistors) and the common point P. An inverter INV drives the gate terminal of one of said transistors (such as T2) while the direct signal from the decoder drives the gate terminal of the other transistor (such as T1). The gate terminal of the transistor T1 and the input of the inverter are connected together at circuit enable node CE so as to form the control terminal of the gate which corresponds to the respective decoder output E1–E8 of FIG. 1.

When the signal of control terminal CE makes a transition from low to high, the transistors T1 and T2 will become conductive turning on the logic gate. When the signal of control terminal CE makes a transition from high to low, the transistors T1 and T2 will become non-conductive turning off the logic gate. Of course, the reverse gate response can be obtained by simply coupling the inverter to the gate of transistor T1 instead of the gate of transistor T2 as shown.

Figure 3:
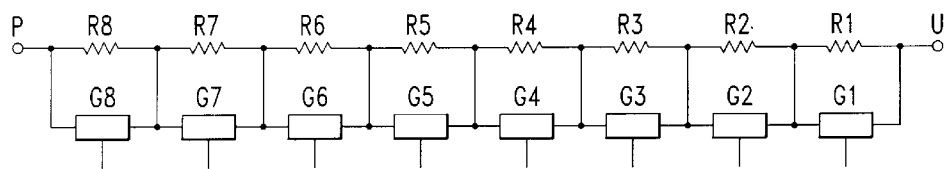
FIGS. 3 through 7 are circuit diagrams of additional embodiments of the invention.

An alternative arrangement is shown in FIG. 3, wherein the logic gates can be arranged in parallel with the individual resistor elements. A decoder (not shown) drives the control terminals of the gates in order to short-circuit one or more of the resistor elements R1–R8. In this case, it may be possible to simultaneously close one or more gates. Accordingly, all permutations of resistors in the set {R1, R2, . . . Rn} are available for selection in such an arrangement. Thus, the range of obtainable resistance values in this embodiment is wider since all the additive combinations of the resistor elements are possible.

Figure 4:
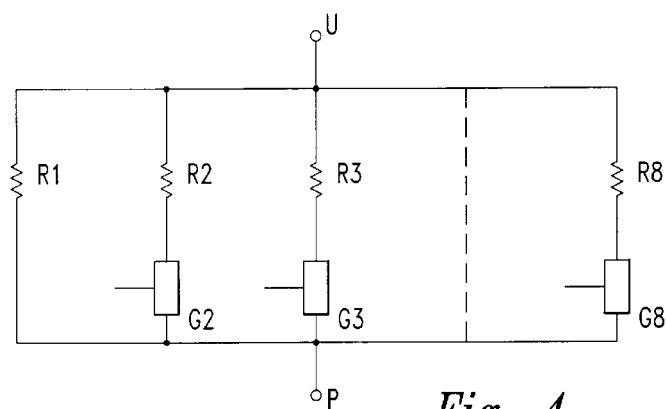

In another embodiment of the invention, the resistor elements R1–R8 are connected in parallel rather than in series, as shown in FIG. 4. Logic gates G2–G8 are arranged in series to each resistor, with the possible exception of the first resistor. It is possible for the circuit to possess a gate G1 (not shown) placed in series with resistor R1 if so desired. Logic gates G2–G8 are controlled by the outputs of a decoder (not shown). In this manner, all the parallel combinations of two or more desired resistor elements can be obtained.

Figure 5:
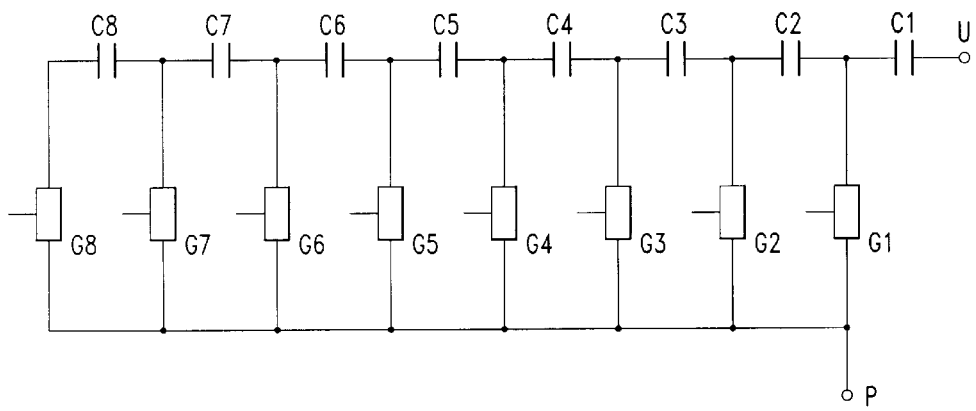
Figure 6:
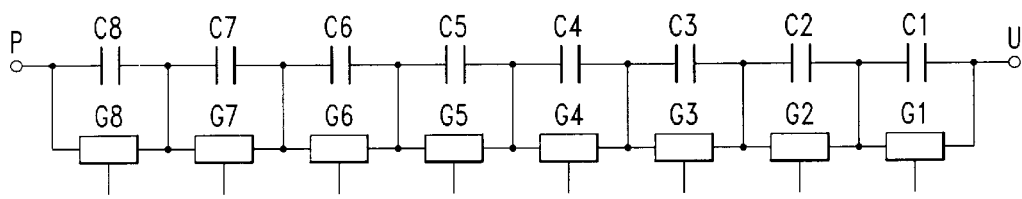
Figure 7:
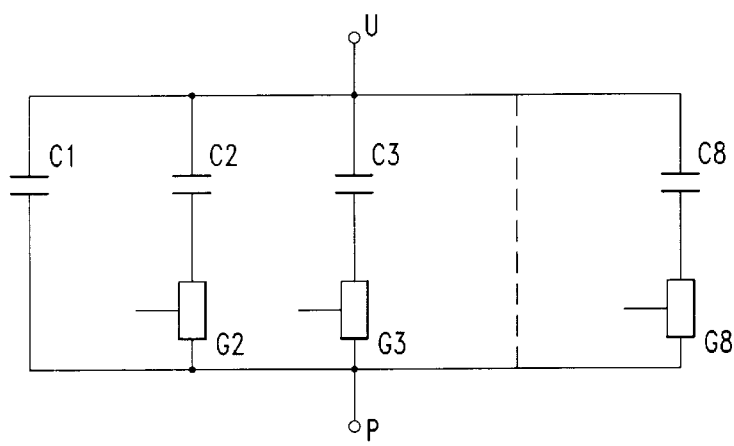

The invention can also utilize passive components such as capacitors. FIG. 5 illustrates another embodiment wherein a plurality of capacitor elements C1–C8 are connected in series and corresponding logic gates G1–G8 are connected in the same manner as in FIG. 1. FIG. 6 shows an embodiment which is similar to network in FIG. 3 except capacitor elements replace resistor elements. Likewise, in FIG. 7 the capacitor elements are connected in an arrangement similar to the network shown in FIG. 4. Many of the remarks previously made for resistors in the prior embodiments are valid for capacitors in these embodiments.

It will be appreciated that the combined values of resistor elements or capacitor elements in a network can be derived from formulas that are well known in the art. For example, the passive component represented by a network of series resistor elements is the simplified equivalent circuit of a single resistor whose value equals the arithmetic sum of the values of the resistor elements. The equivalent circuit of resistor elements in parallel is determined by solving the equation in which the reciprocal of the value of the equivalent resistor equals the sum of the reciprocals of the values of the resistor elements connected in parallel. Similar formulas can be used for determining the equivalent circuit or combined value of capacitor elements in parallel or in series, respectively.

Although all the examples provided contain eight individual passive elements (resistors or capacitors) for the sake of uniformity in description, the number of elements can be chosen arbitrarily according to the required precision. Furthermore, it is possible to combine a series arrangement of passive elements with a parallel arrangement of passive elements to adapt the circuit to the particular requirements of the integrated circuit.

We claim:

1. An integrated circuit having a trimmable passive circuit component adjustable to achieve a precise target value, comprising:

a decoder having N inputs and M outputs, M being related to and exceeding N;

a plurality of gates, said gates being coupled to and controlled by said M outputs;

a network of series-connected passive elements connected to provide said target value for the passive circuit component, one of said passive elements being coupled to a first node, each one of said gates connecting one or more passive elements between said first node and a second node, wherein a predetermined number of passive elements of said plurality of passive elements are capable of being connected in series between said first node and said second node according to a predetermined set of signals to the inputs of said decoder to provide said target component value precisely;

an operational amplifier having a first input for receiving a signal to be amplified, a second input for receiving a feedback signal and an output, said output being coupled to said first node, a last passive element in the plurality of series-connected passive elements being coupled to said second input, a last gate of said plurality of gates coupling said input to said second node;

a load resistor establishing a third node above ground potential;

a first capacitor coupling said second and third nodes; and a second capacitor coupling said first and third nodes.

2. The integrated circuit according to claim 1 wherein each of said gates comprise: first and second complementary CMOS transistors, each having a gate terminal, a source and a drain, the sources of both of said transistors being coupled together and the drains of both of said transistors being coupled together, the respective decoder output being connected directly to the gate terminal of one of said transistors and connected through an inverter to the gate terminal of the other of said transistors.

3. The integrated circuit according to claim 1 wherein the relationship between N and M is $M=2^N$.

4. The integrated circuit according to claim 1 wherein said passive elements are resistor elements.

5. The integrated circuit according to claim 1 wherein said passive elements are capacitor elements.

6. An integrated circuit having a passive circuit component adjustable to achieve a precise target value, comprising:

a decoder having N inputs and M outputs, M being related to and exceeding N;

a plurality of gates, said gates being coupled to and controlled by said M outputs;

a network of series-connected capacitor elements for defining the value of the passive circuit component, the opposite ends of the series of capacitor elements defining first and second nodes, each one of said gates being connected in parallel to a corresponding one of said capacitor elements, wherein a predetermined number of capacitor elements of said plurality of capacitor elements are capable of being connected in series between said first node and said second node according to a predetermined set of signals to the inputs of said decoder;

an operational amplifier having a first input for receiving a signal to be amplified, a second input for receiving a feedback signal and an output, said output being coupled to said first node, said second input being coupled to said second node;

a load resistor establishing a third node above ground potential;

a first capacitor coupling said second and third nodes; and a second capacitor coupling said first and third nodes.

7. The integrated circuit according to claim 6 wherein each of said gates comprise:

first and second complementary CMOS transistors, each having a gate terminal, a source and a drain, the sources of both of said transistors being coupled together and the drains of both of said transistors being coupled together, the respective decoder output being connected directly to the gate terminal of one of said transistors and connected through an inverter to the gate terminal of the other of said transistors.

* * * * *